United States Patent
Ye et al.

(10) Patent No.: US 12,376,341 B2
(45) Date of Patent: Jul. 29, 2025

(54) RADIO-FREQUENCY SWITCH HAVING REDISTRIBUTION LAYER INDUCTANCE

(71) Applicant: SKYWORKS SOLUTIONS, INC., Irvine, CA (US)

(72) Inventors: Peihua Ye, Irvine, CA (US); Guillaume Alexandre Blin, Carlisle, MA (US); Thomas Obkircher, Santa Ana, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 377 days.

(21) Appl. No.: 17/851,169

(22) Filed: Jun. 28, 2022

(65) Prior Publication Data

US 2022/0416084 A1    Dec. 29, 2022

Related U.S. Application Data

(60) Provisional application No. 63/216,394, filed on Jun. 29, 2021.

(51) Int. Cl.
    *H10D 30/67*    (2025.01)
    *H03D 7/14*     (2006.01)

(52) U.S. Cl.
    CPC ....... *H10D 30/6755* (2025.01); *H03D 7/1441* (2013.01)

(58) Field of Classification Search
    None
    See application file for complete search history.

(56) References Cited

U.S. PATENT DOCUMENTS

| | | | |
|---|---|---|---|
| 10,447,323 B2* | 10/2019 | Lee ........................ | H04B 1/44 |
| 2008/0136572 A1* | 6/2008 | Ayazi ..................... | H01F 21/12 |
| | | | 336/90 |
| 2016/0020816 A1* | 1/2016 | Lee ....................... | H03K 17/693 |
| | | | 455/78 |
| 2016/0126199 A1* | 5/2016 | Roy ....................... | H01L 25/16 |
| | | | 257/664 |
| 2019/0123686 A1* | 4/2019 | Min ...................... | H03B 5/1265 |

(Continued)

FOREIGN PATENT DOCUMENTS

CN    105810647 A    7/2016

OTHER PUBLICATIONS 2209396.7, GB, Radio-Frequency Switch Having Redistribution Layer Inductance, Jun. 27, 2022.

(Continued)

*Primary Examiner* — Nduka E Ojeh
(74) *Attorney, Agent, or Firm* — Chang & Hale LLP

(57) ABSTRACT

In some embodiments, a semiconductor chip device can include a semiconductor substrate having a switching circuit with a first node, and a plurality of layers configured to support the semiconductor substrate and to provide electrical connections for the switching circuit between a second node connectable to a location external to the semiconductor chip and the first node. The plurality of layers can include a redistribution layer, and a signal path can be implemented as a part of the redistribution layer. The signal path can have a first end electrically connected to the first node and a second end electrically connected to the second node, and be configured to provide a selected inductance.

14 Claims, 7 Drawing Sheets

(56) References Cited

U.S. PATENT DOCUMENTS

2021/0193597 A1\* 6/2021 Eid .................. H01H 1/0036
2021/0407979 A1\* 12/2021 We ...................... H01L 25/16

OTHER PUBLICATIONS

10202250326Q, SG, Radio-Frequency Switch Having Redistribution Layer Inductance, Jun. 29, 2022.
111124259, TW, Radio-Frequency Switch Having Redistribution Layer Inductance, Jun. 29, 2022.

\* cited by examiner

RADIO-FREQUENCY SWITCH HAVING REDISTRIBUTION LAYER INDUCTANCE

CROSS-REFERENCE TO RELATED APPLICATION(S)

This application claims priority to U.S. Provisional Application No. 63/216,394 filed Jun. 29, 2021, entitled RADIO-FREQUENCY SWITCH HAVING REDISTRIBUTION LAYER INDUCTANCE, the disclosure of which is hereby expressly incorporated by reference herein in its respective entirety.

BACKGROUND

Field

The present disclosure relates to devices and methods related to radio-frequency switches.

Description of the Related Art

In radio-frequency (RF) applications, switches are utilized to provide various functionalities such as routing of signals. Many of such switches are implemented as switching transistors.

SUMMARY

In accordance with some implementations, the present disclosure relates to a semiconductor chip that includes a semiconductor substrate having a switching circuit with a first node, and a plurality of layers configured to support the semiconductor substrate and to provide electrical connections for the switching circuit between a second node connectable to a location external to the semiconductor chip and the first node. The plurality of layers includes a redistribution layer. The semiconductor chip further includes a signal path implemented as a part of the redistribution layer. The signal path has a first end electrically connected to the first node and a second end electrically connected to the second node, and is configured to provide a selected inductance.

In some embodiments, the signal path can be configured so that the selected inductance compensates for some or all of parasitic capacitance associated with the switching circuit. In some embodiments, the semiconductor chip can be implemented as a flip chip device. In some embodiments, the semiconductor substrate can include a silicon-on-insulator substrate. The switching circuit can include a plurality of switching transistors, such that at least some of the parasitic capacitance results from one or more switching transistors in an OFF state.

In some embodiments, the selected inductance compensating for the parasitic capacitance can result in a reduced insertion loss associated with the switching circuit.

In some embodiments, the redistribution layer can be positioned away from the semiconductor substrate among the plurality of layers. For example, the redistribution layer can be a layer furthest away from the semiconductor substrate among the plurality of layers.

In some embodiments, the signal path can include a copper trace. The copper trace can have thickness and width values and extend in partial or full winding(s) to provide the selected inductance and a desired Q value. For example, the selected inductance can be in a range of 0.1 nH to 10 nH, and the desired Q value can be greater than 20. As a more specific example, the selected inductance can be in a range of 0.8 nH to 1.2 nH, and the desire Q value can be at least 25 at a frequency in a range of 2 GHz to 3 GHz.

In some embodiments, the copper trace can extend in approximately one winding.

In some embodiments, the second node can be configured to receive an amplified signal from a power amplifier. In some embodiments, the first node can be configured as a pole connectable to one or more of a plurality of throws of the switching circuit.

In some teachings, the present disclosure relates to a method for manufacturing a semiconductor chip device. The method includes forming a plurality of layers including a redistribution layer. The forming of the redistribution layer includes implementing a signal path as part of the redistribution layer such that the signal path provides a selected inductance with a first end electrically connected to a first node and a second end electrically connected to a second node. The method further includes coupling a semiconductor substrate with a switching circuit to the plurality of layers, such that the first node is electrically connected to the switching circuit and the second node is connectable to a location external to the semiconductor chip device.

In some implementations, the present disclosure relates to a packaged module that includes a packaging substrate and a semiconductor chip mounted on the packaging substrate. The semiconductor chip includes a semiconductor substrate having a switching circuit with a first node, and a plurality of layers configured to support the semiconductor substrate and to provide electrical connections for the switching circuit between a second node connectable to a location external to the semiconductor chip and the first node. The plurality of layers includes a redistribution layer. The semiconductor chip further includes a signal path implemented as a part of the redistribution layer. The signal path has a first end electrically connected to the first node and a second end electrically connected to the second node, and is configured to provide a selected inductance.

In some embodiments, the signal path can be configured so that the selected inductance compensates for some or all of parasitic capacitance associated with the switching circuit. In some embodiments, the semiconductor chip can be implemented as a flip chip device. In some embodiments, the semiconductor substrate can include a silicon-on-insulator substrate.

In some embodiments, the selected inductance compensating for the parasitic capacitance can result in a reduced insertion loss associated with the switching circuit.

In some embodiments, the redistribution layer can be positioned away from the semiconductor substrate among the plurality of layers. For example, the redistribution layer can be a layer furthest away from the semiconductor substrate among the plurality of layers.

In some embodiments, the packaged module can be implemented as a front-end module or an antenna switching circuit. The second node can be configured to receive an amplified signal from a power amplifier, and the first node can be configured as a pole connectable to one or more of a plurality of throws of the switching circuit.

In some implementations, the present disclosure relates to a wireless device that includes a transceiver, an antenna, and a switching device implemented to be electrically between the transceiver and the antenna. The switching device includes a semiconductor chip that includes a semiconductor substrate having a switching circuit with a first node, and a plurality of layers configured to support the semiconductor substrate and to provide electrical connections for the switching circuit between a second node connectable to a location external to the semiconductor chip and the first node. The plurality of layers includes a redistribution layer. The semiconductor chip further includes a signal path implemented as a part of the redistribution layer. The signal path has a first end electrically connected to the first node and a second end electrically connected to the second node, and is configured to provide a selected inductance.

In some embodiments, the signal path can be configured so that the selected inductance compensates for some or all of parasitic capacitance associated with the switching circuit. In some embodiments, the semiconductor chip can be implemented as a flip chip device. In some embodiments, the wireless device can further include a power amplifier implemented to be electrically between the transceiver and the switching device, such that the second node is configured to receive an amplified signal from the power amplifier.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
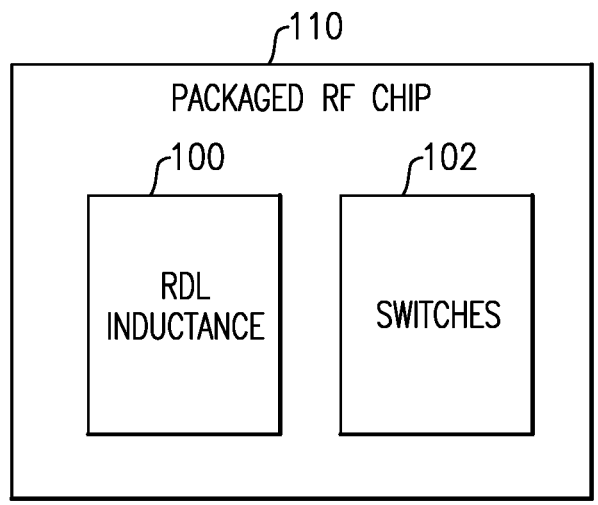
FIG. 1 depicts a packaged radio-frequency (RF) chip device that includes a switching circuit indicated as switches.

FIG. 1 depicts a packaged radio-frequency (RF) chip device 110 that includes a switching circuit indicated as switches 102. Such switches can be implemented as, for example, silicon-on-insulator (SOI) devices. In some embodiments, the RF chip device 110 can include a redistribution layer (RDL) inductance having a desired inductance value to provide one or more functionalities as described herein.

Figure 2:
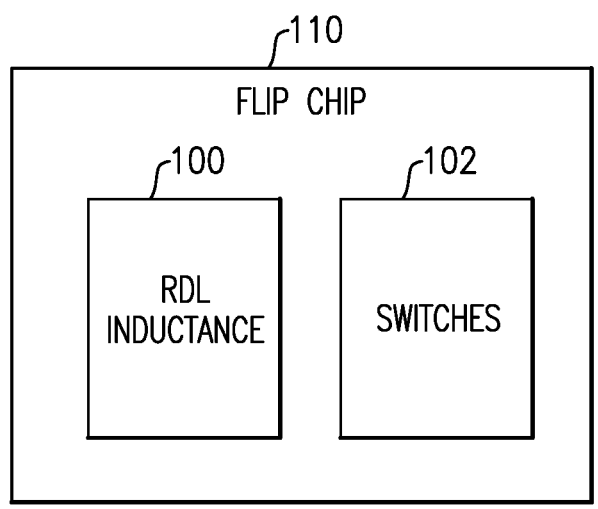
FIG. 2 shows that in some embodiments, the RF device of FIG. 1 can be implemented as a flip chip device.

FIG. 2 shows that in some embodiments, the RF chip device 110 of FIG. 1 can be implemented as a flip chip device 110. Such a flip chip device can include a switching circuit 102 and an RDL inductance 100 having one or more features as described herein. Although various examples are described herein in the context of flip chips, it will be understood that one or more features of the present disclosure can also be implemented in other types of RF chip devices.

Figure 3:
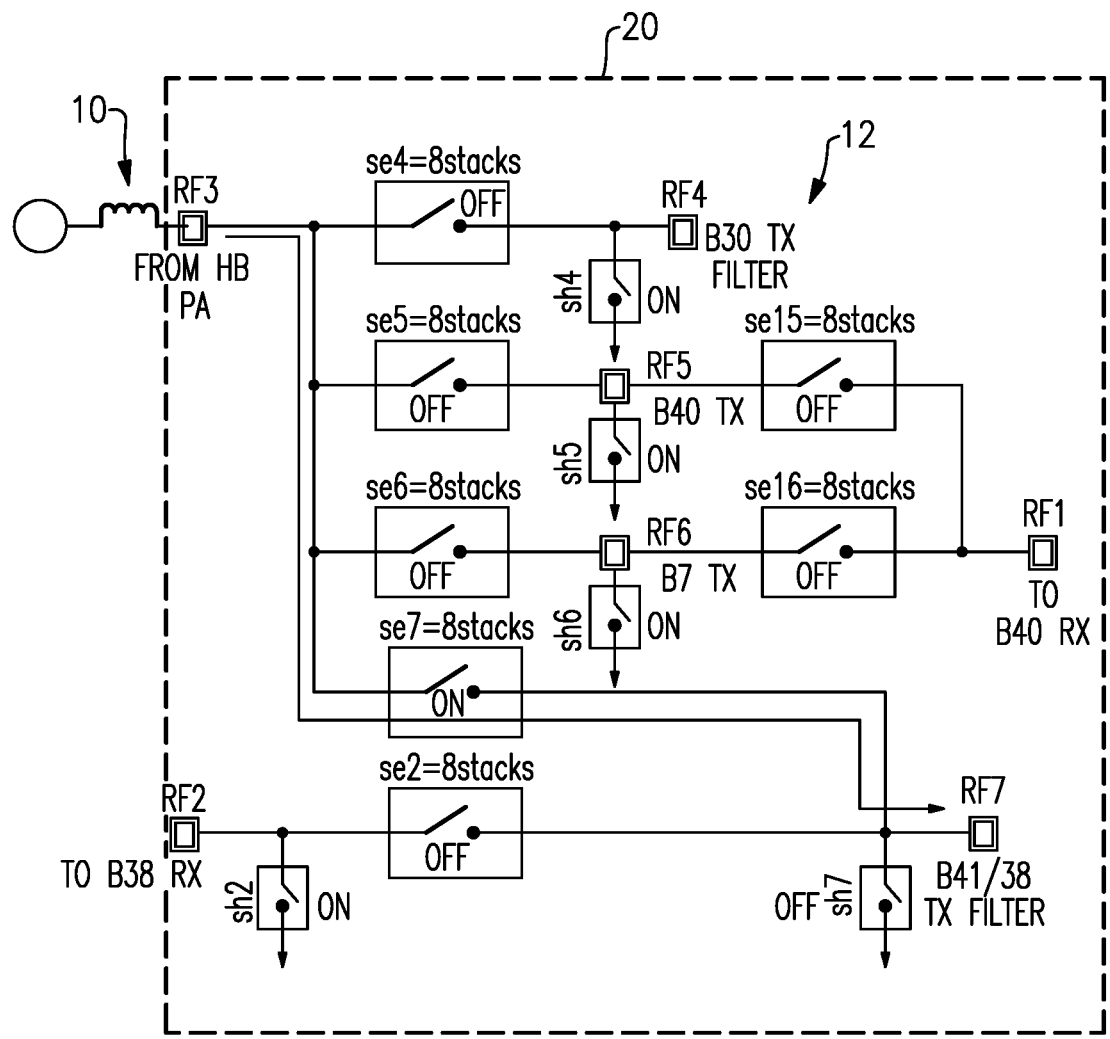
FIG. 3 shows an example of a conventional flip chip device.

FIG. 3 shows an example of a conventional flip chip device generally indicated by a dashed box 20. The conventional flip chip device 20 is shown to include a switching circuit 12 configured to support transmit and/or receive operations involving one or more frequency bands. When such a flip chip device is implemented in a packaged module or a circuit board, an external inductor 10 can be provided to compensate for parasitic capacitance associated with the switching transistors of the switching circuit 12. For example, some or all of OFF state switching transistor stacks can provide an OFF-capacitance (Coff) value for the switching circuit 12, and some or all of such a Coff can result in an undesirable parasitic capacitance effect.

More particularly, in the example of FIG. 3, the switching circuit 12 is shown to include band selection functionality for either or both of transmit (Tx) and receive (Rx) operations. For example, transmit operation for B41/38 band can be achieved by receiving an amplified signal from a power amplifier through the external inductor 10 and an input node RF3. From the input node RF3, three band paths corresponding to bands B30, B40 and B7 are shown to be disabled with their respective series switches OFF and respective shunt switches ON; and the fourth band path corresponding to band B41/38 is shown to be enabled with its series switch ON and shunt switch OFF. Accordingly, the amplified signal received at the input node RF3 is shown to be routed to an output node RF7 through the series switch indicated as SE7.

In the foregoing example, the three Tx series switches SE4, SE5 and SE6, Rx series switches SE15, SE16 and SE2, and the shunt switch SH7 are in OFF states. Thus, some or all of such OFF switches can contribute to parasitic capacitance of the switching circuit 12.

In the example of FIG. 3, the output node RF7 for transmit operation can also function as an input node for receive operation. For example, a signal received through an antenna can be provided to node RF7 as an input, and such a received signal can be routed to an output node RF2 which in turn is coupled to a receiver circuit. To achieve such an operation, a series switch (SE2) between the nodes RF7 and RF2 can be turned ON, and the shunt switches SH7 and SH2, as well as the Tx series switch SE7, can be turned OFF.

It is noted that in the example configuration of FIG. 3, the use of the external inductor 10 typically results in an increased cost associated with the implementation of the flip chip device 20.

Figure 4:
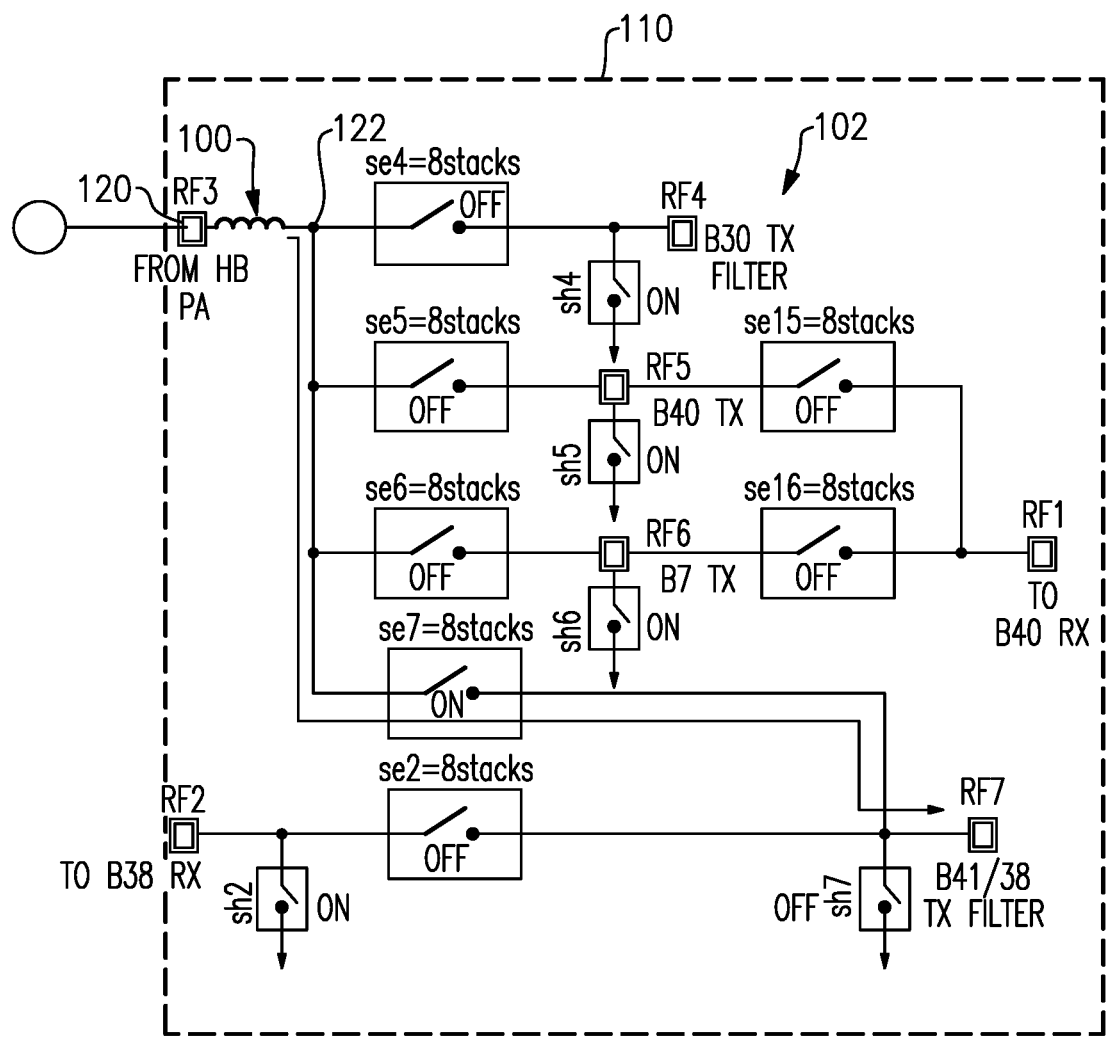
FIG. 4 shows that in some embodiments, a flip chip device can include a switching circuit configured to support transmit and/or receive operations involving one or more frequency bands.

FIG. 4 shows that in some embodiments, a flip chip device generally indicated by a dashed box 110 can include a switching circuit 102 configured to support transmit and/or receive operations involving one or more frequency bands. The flip chip device 110 can further include a redistribution layer (RDL) inductance 100 configured to provide a desired inductance value to provide one or more functionalities as described herein. For example, such a desired inductance value can be selected to compensate for parasitic capacitance associated with the switching transistors of the switching circuit 102 (e.g., undesirable parasitic capacitance effect resulting from OFF-capacitance (Coff) associated with some or all of OFF state switching transistor stacks).

In the example of FIG. 4, the flip chip device 110 can include a signal node 120 for being connected to a circuit exterior to the flip chip device 110. For example, the signal node 120 (also indicated as RF3) can be utilized for receiving an amplified signal from a power amplifier, and such an amplified signal can be routed to a signal node (RF7) that is connected to a transmit filter (external to the flip chip device 110.

More particularly, in an example context of a transmit operation involving band B41/38 (similar to the example of FIG. 3), the switching circuit 102 is shown to include band selection functionality for either or both of transmit (Tx) and receive (Rx) operations. For example, transmit operation for B41/38 band can be achieved by receiving an amplified signal from a power amplifier through the signal node 120 (RF3) as an input, and be routed to the signal node RF7 as an output through the RDL inductance 100 and a series switch SE7. During such a transmit operation, three Tx series switches SE4, SE5 and SE6, Rx series switches SE15, SE16 and SE2, and the shunt switch SH7 are in OFF states. Thus, some or all of such OFF switches can contribute to parasitic capacitance of the switching circuit 12. In some embodiments, the RDL inductance 100 can be configured to provide an inductance value to tune out some or all of parasitic capacitance effects resulting from such OFF switches.

In the example of FIG. 4, it will be understood that the switching circuit 102 can also support receive operations, similar to the example of FIG. 3.

In the example of FIG. 4, the RDL inductance 100 is shown to be implemented within the flip chip device 110, so as to be electrically between the signal node 120 and a signal node 122. In some embodiments, the signal node 120 can be, or be connected to, a bumper feature of the flip chip device 110, and the signal node 122 can be, or be connected to, a die pad of a semiconductor die (e.g., SOI die) associated with the switching circuit 102.

In some embodiments, the RDL inductance 100 can be implemented as a part of a redistribution layer (RDL) associated with a flip chip device. For example, in a copper pillar flip chip bumping process, a copper layer redistribution layer can be configured to connect die pads (e.g., node 122 in FIG. 4) with bumper structures (e.g., node 120 in FIG. 4). Such a copper redistribution layer is relatively thick (e.g., over 5 μm) and is typically implemented away from the corresponding semiconductor substrate (e.g., silicon substrate). Accordingly, an RDL inductance as described herein can be designed to achieve a Q value greater than 20, which is better than a Q value associated with an on-chip inductor. With such high Q, an RDL inductor having one or more features as described herein can be utilized to tune out one or more effects associated with RF switch parasitic capacitance, and reduce insertion losses.

Figure 5A:
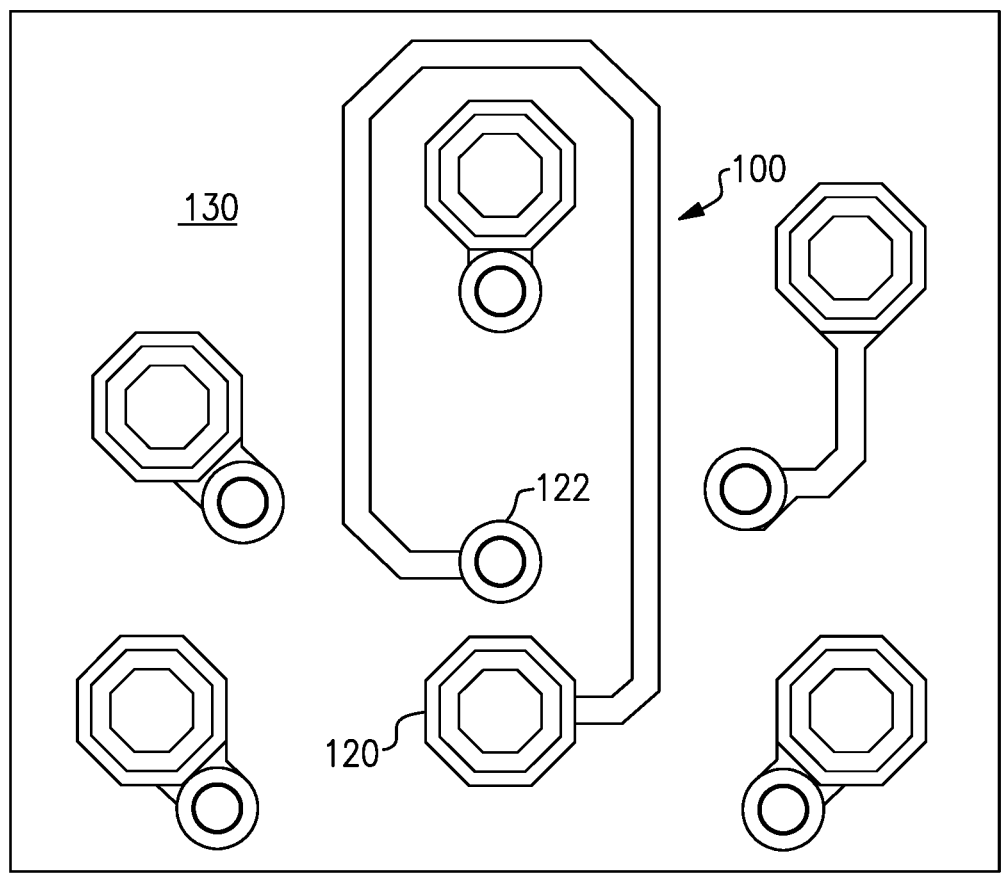
FIG. 5A shows an example layout of a redistribution layer (RDL) inductance that can be implemented for the RDL inductance of FIG. 4.
Figure 5B:
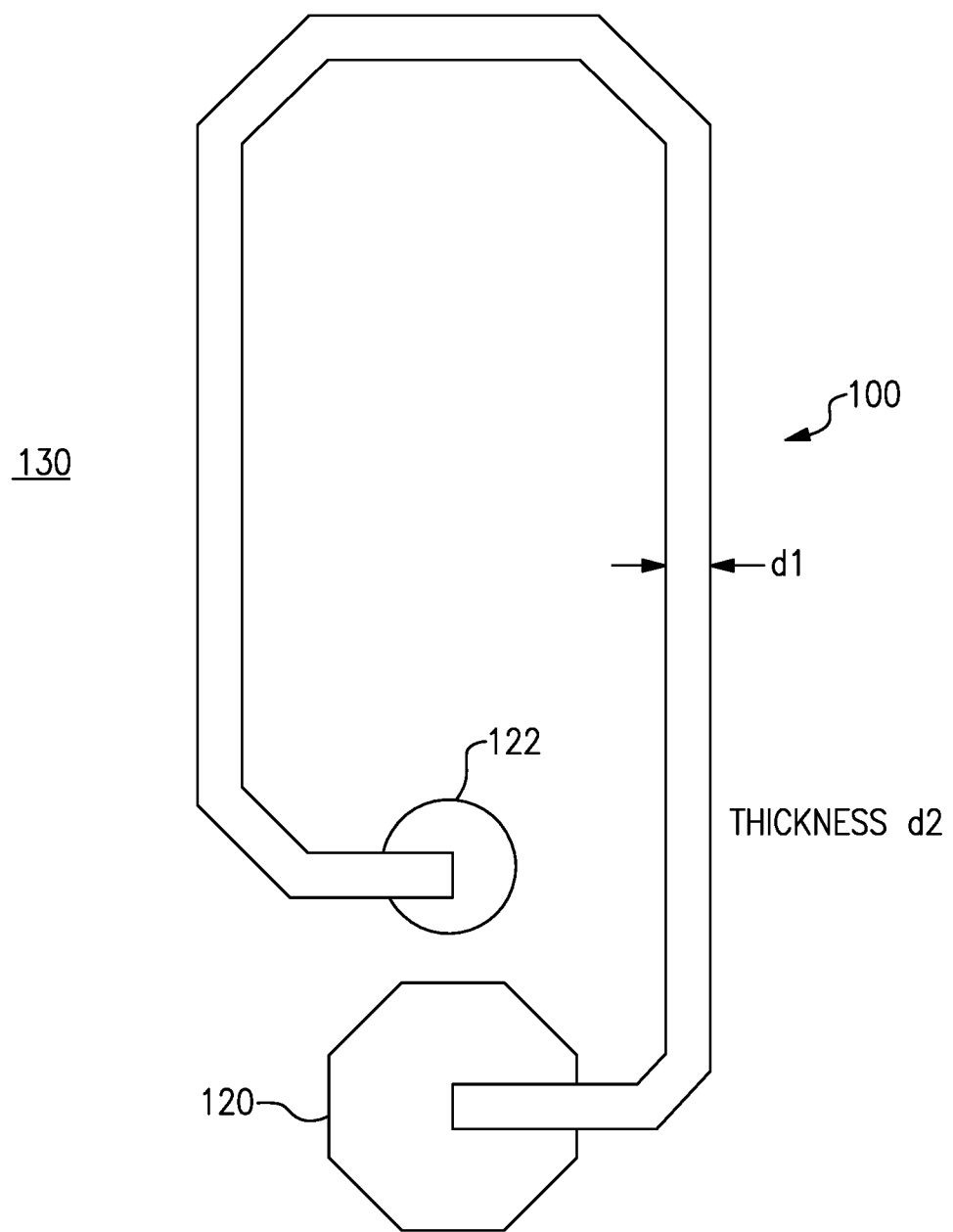
FIG. 5B shows an isolated view of the RDL inductance of FIG. 5A.

FIG. 5A shows an example layout of an RDL inductance 100 that can be implemented for the RDL inductance 100 of FIG. 4. FIG. 5B shows an isolated view of the RDL inductance 100 of FIG. 5A.

Referring to FIGS. 5A and 5B, the example RDL inductance 100 is shown to be implemented as a part of a redistribution layer 130 to provide a shaped signal path between nodes 120 and 122. As described above in reference to FIG. 4, the node 120 can be associated with a bumper structure to provide a connection to a location external to the corresponding flip chip device, and the node 120 can be associated with a die pad to provide a connection to a switching circuit within the corresponding semiconductor die. In the context of the example shown in FIG. 4, the node 120 can be utilized to receive an amplified signal from a power amplifier external to the flip chip device, and the node 122 can be utilized to route the amplified signal to the switching circuit.

In the example shown in FIGS. 5A and 5B, the RDL inductance 100 is implemented as a signal path (e.g., copper trace) having a width dimension d1 and a thickness dimension d2. With appropriate dimensions of d1 and d2, such an RDL inductance can provide, for example, a value of about 1.1 nH, and a Q value of about 25 at 2.7 GHz.

In the example shown in FIGS. 5A and 5B, the RDL inductance 100 is implemented as a signal path having approximately one winding. It will be understood that an RDL inductance having one or more features as described herein can be implemented to provide less than one winding or greater than one winding.

Figure 6:
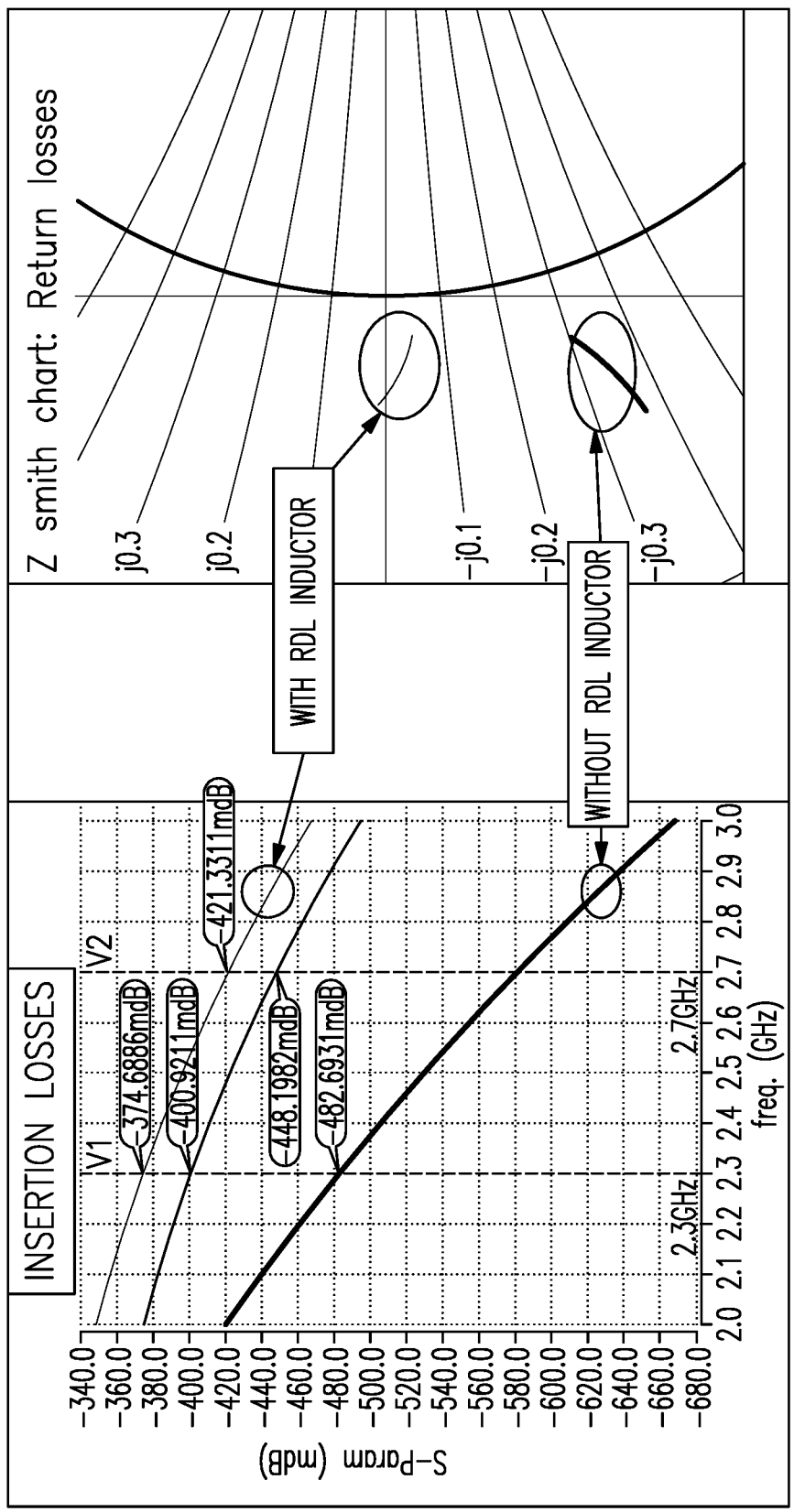
FIG. 6 shows insertion loss and return loss plots, with and without an RDL inductance, for the example configuration of FIG. 4.

FIG. 6 shows insertion loss and return loss plots, with and without an RDL inductance, for the example configuration of FIG. 4, where the RDL inductance 100 provides a value of about 1.1 nH. With such a configuration, the presence of the RDL inductance 100 can reduce RF insertion losses by about 0.2 dB, which is significant for RF switches.

Figure 7:
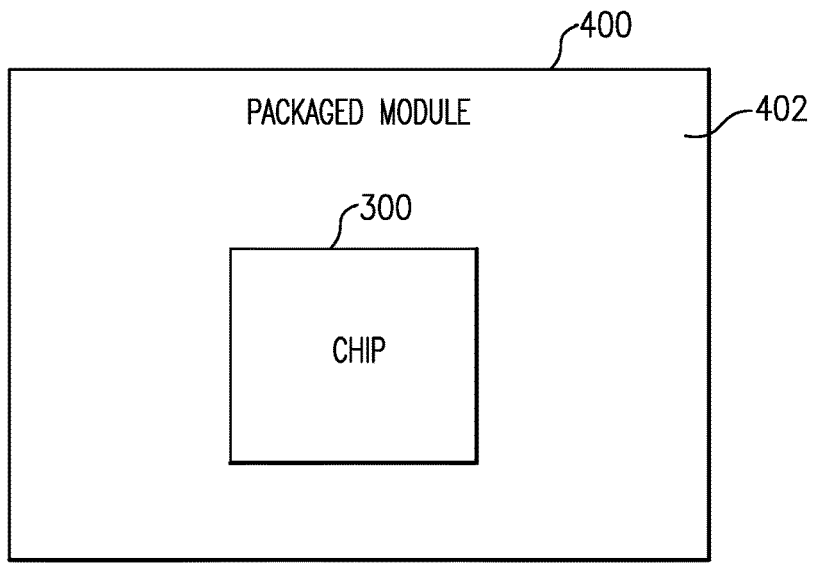
FIG. 7 shows that in some embodiments, one or more features as described herein can be implemented in a packaged module.

FIG. 7 shows that in some embodiments, one or more features as described herein can be implemented in a packaged module 400. Such a packaged module can include a packaging substrate 402 configured to receive a plurality of components. At least some of the components mounted on the packaging substrate 402 can include a flip chip device 300 such as one or more of the example flip chip devices described herein (e.g., 110 in FIGS. 1 and 2).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
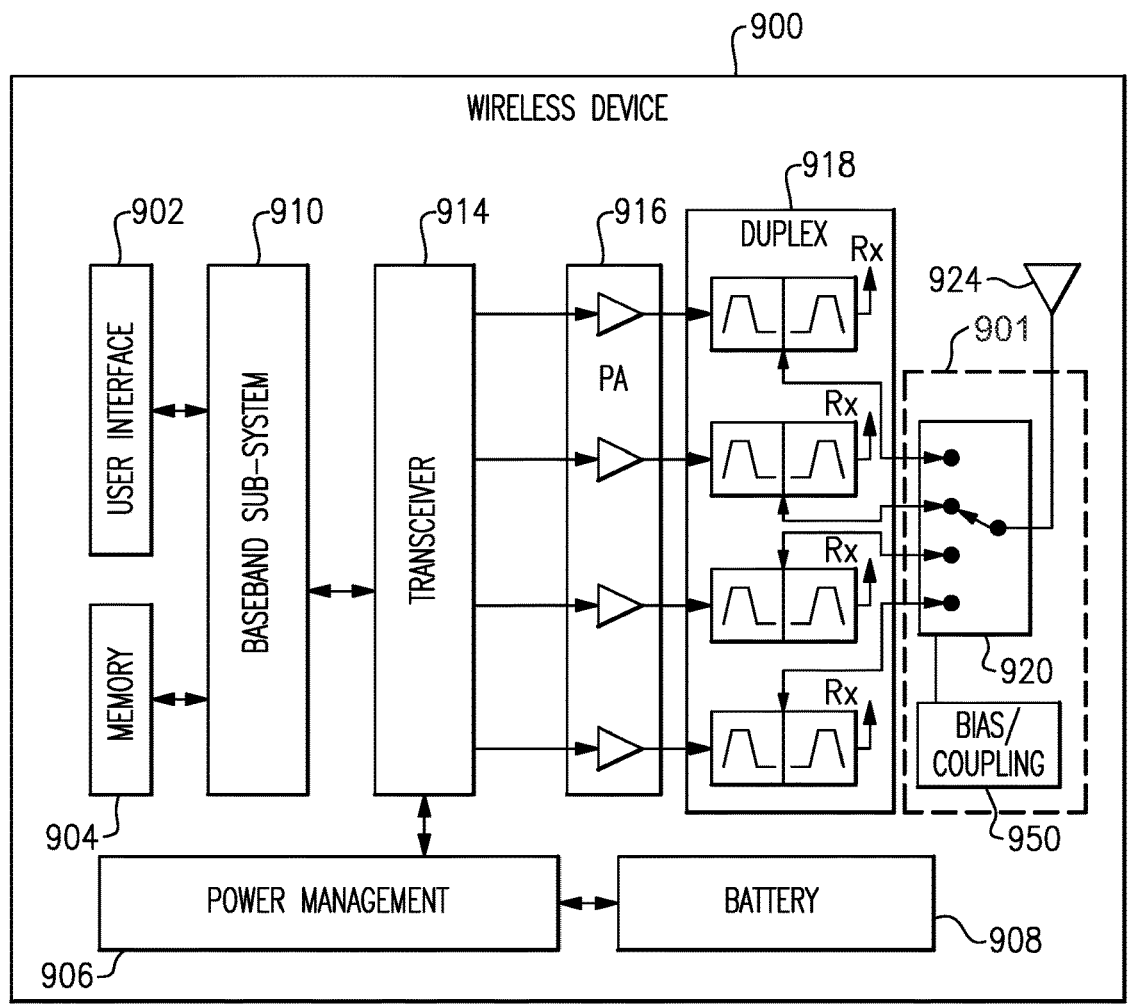
FIG. 8 depicts an example wireless device having one or more advantageous features described herein.

FIG. 8 depicts an example wireless device 900 having one or more advantageous features described herein. In some embodiments, a switching module 920 can include one or more RDL inductance as described herein.

In the example wireless device 900, a power amplifier (PA) assembly 916 having a plurality of PAs can provide one or more amplified RF signals to the switch 920 (via an assembly of one or more duplexers 918), and the switch 920 can route the amplified RF signal(s) to one or more antennas. The PAs 916 can receive corresponding unamplified RF signal(s) from a transceiver 914 that can be configured and operated in known manners. The transceiver 914 can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 910.

The baseband sub-system 910 is shown to be connected to a user interface 902 to facilitate various input and output of voice and/or data provided to and received from the user.

The baseband sub-system 910 can also be connected to a memory 904 that is configured to store data and/or instructions to facilitate the operation of the wireless device, and/or to provide storage of information for the user.

In some embodiments, the duplexers 918 can allow transmit and receive operations to be performed simultaneously using a common antenna (e.g., 924). In FIG. 8, received signals are shown to be routed to "Rx" paths that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor chip comprising:
a semiconductor substrate having a switching circuit with a first node;
a plurality of layers configured to support the semiconductor substrate and to provide electrical connections for the switching circuit between a second node connectable to a location external to the semiconductor chip and the first node, the plurality of layers including a redistribution layer that is a layer positioned furthest away from the semiconductor substrate among the plurality of layers; and
a signal path implemented as a part of the redistribution layer, the signal path having a first end electrically connected to the first node and a second end electrically connected to the second node, the signal path configured to provide a selected inductance that compensates for some or all of parasitic capacitance associated with the switching circuit.

2. The semiconductor chip of claim 1 wherein the semiconductor chip is implemented as a flip chip device.

3. The semiconductor chip of claim 1 wherein the semiconductor substrate includes a silicon-on-insulator substrate.

4. The semiconductor chip of claim 3 wherein the switching circuit includes a plurality of switching transistors, such that at least some of the parasitic capacitance results from one or more switching transistors in an OFF state.

5. The semiconductor chip of claim 1 wherein the selected inductance compensating for the parasitic capacitance results in a reduced insertion loss associated with the switching circuit.

6. The semiconductor chip of claim 1 wherein the second node is configured to receive an amplified signal from a power amplifier.

7. The semiconductor chip of claim 1 wherein the first node is configured as a pole connectable to one or more of a plurality of throws of the switching circuit.

8. A semiconductor chip comprising:
a semiconductor substrate having a switching circuit with a first node;
a plurality of layers configured to support the semiconductor substrate and to provide electrical connections for the switching circuit between a second node connectable to a location external to the semiconductor chip and the first node, the plurality of layers including a redistribution layer; and
a signal path implemented as a part of the redistribution layer, the signal path having a first end electrically connected to the first node and a second end electrically connected to the second node, the signal path configured to provide a selected inductance that compensates for some or all of parasitic capacitance associated with the switching circuit, the signal path including a copper trace having thickness and width values and extends in partial or full winding(s) to provide the selected inductance and a desired Q value.

9. The semiconductor chip of claim 8 wherein the selected inductance is in a range of 0.1 nH to 10 nH, and the desired Q value is greater than 20.

10. The semiconductor chip of claim 9 wherein the selected inductance in a range of 0.8 nH to 1.2 nH, and the desire Q value is at least 25 at a frequency in a range of 2 GHz to 3 GHZ.

11. The semiconductor chip of claim 9 wherein the copper trace extends in approximately one winding.

12. A method for manufacturing a semiconductor chip device, the method comprising:

forming a plurality of layers including a redistribution layer, the forming of the redistribution layer including implementing a signal path as part of the redistribution layer such that the signal path provides a selected inductance with a first end electrically connected to a first node and a second end electrically connected to a second node; and coupling a semiconductor substrate with a switching circuit to the plurality of layers, such that the first node is electrically connected to the switching circuit and the second node is connectable to a location external to the semiconductor chip device, such that the redistribution layer is a layer positioned furthest away from the semiconductor substrate among the plurality of layers, and the selected inductance compensates for some or all of parasitic capacitance associated with the switching circuit.

13. A packaged module comprising:

a packaging substrate; and a semiconductor chip mounted on the packaging substrate, the semiconductor chip including a semiconductor substrate having a switching circuit with a first node, and a plurality of layers configured to support the semiconductor substrate and to provide electrical connections for the switching circuit between a second node connectable to a location external to the semiconductor chip and the first node, the plurality of layers including a redistribution layer that is a layer positioned furthest away from the semiconductor substrate among the plurality of layers, the semiconductor chip further including a signal path implemented as a part of the redistribution layer, the signal path having a first end electrically connected to the first node and a second end electrically connected to the second node, the signal path configured to provide a selected inductance that compensates for some or all of parasitic capacitance associated with the switching circuit.

14. The packaged module of claim 13 wherein the semiconductor chip is implemented as a flip chip device.

\* \* \* \* \*